(12) United States Patent
Kobayashi

(10) Patent No.: US 9,763,332 B2
(45) Date of Patent: Sep. 12, 2017

(54) SUPPORT BODY, METHOD OF MANUFACTURING SUPPORT BODY, METHOD OF MANUFACTURING WIRING BOARD, METHOD OF MANUFACTURING ELECTRONIC COMPONENT, AND WIRING STRUCTURE

(71) Applicant: SHINKO ELECTRIC INDUSTRIES CO., LTD., Nagano-shi, Nagano (JP)

(72) Inventor: Kazuhiro Kobayashi, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 62 days.

(21) Appl. No.: 14/938,157

(22) Filed: Nov. 11, 2015

(65) Prior Publication Data

US 2016/0066433 A1    Mar. 3, 2016

Related U.S. Application Data

(63) Continuation of application No. 13/945,266, filed on Jul. 18, 2013, now Pat. No. 9,215,812.

(30) Foreign Application Priority Data

Jul. 20, 2012    (JP) ................................ 2012-162005

(51) Int. Cl.
*H05K 1/03*    (2006.01)
*H05K 3/04*    (2006.01)
(Continued)

(52) U.S. Cl.
CPC ........... *H05K 3/04* (2013.01); *H01L 21/4857* (2013.01); *H01L 23/49822* (2013.01);
(Continued)

(58) Field of Classification Search
CPC ... H05K 1/00; H05K 1/11; H05K 3/00; H05K 3/02; H05K 3/10; H05K 3/34; H05K 3/38;
(Continued)

(56) References Cited

U.S. PATENT DOCUMENTS 7,223,687 B1 * 5/2007 Ho ........................ H05K 3/0058
29/829
8,168,513 B2 * 5/2012 Liu ..................... H01L 21/4857
156/239

(Continued)

FOREIGN PATENT DOCUMENTS

JP    2001-127119    5/2001
JP    2005-244124    9/2005

(Continued)

OTHER PUBLICATIONS

JP 2009-032918 English translation.

*Primary Examiner* — Xiaoliang Chen
(74) *Attorney, Agent, or Firm* — Rankin, Hill & Clark LLP

(57) ABSTRACT

A method of manufacturing a support body includes: (a) preparing a support substrate; (b) preparing a metal foil on which a peeling layer is provided; (c) providing an adhesion adjusting layer on the support substrate in a certain region of the support substrate excluding an outer peripheral portion of the support substrate, wherein the adhesion adjusting layer is configured to adjust a contact area between the peeling layer and the support substrate; and (d) providing the metal foil on the support substrate such that the peeling layer provided on the metal foil faces the support substrate via the adhesion adjusting layer. In step (d), the adhesion adjusting layer is adhered to the support substrate, and the peeling layer is adhered to the outer peripheral portion of the support (Continued)

substrate, and is in contact with the adhesion adjusting layer but is not adhered to the adhesion adjusting layer.

3 Claims, 8 Drawing Sheets

(51) Int. Cl.
*H05K 3/00* (2006.01)
*H05K 3/46* (2006.01)
*H01L 23/498* (2006.01)
*H01L 21/48* (2006.01)

(52) U.S. Cl.
CPC ..... *H01L 23/49827* (2013.01); *H05K 3/0097* (2013.01); *H05K 3/4682* (2013.01); *H01L 2224/16225* (2013.01); *H01L 2224/32225* (2013.01); *H01L 2224/73204* (2013.01); *H05K 2203/122* (2013.01); *H05K 2203/1383* (2013.01); *Y10T 428/239* (2015.01)

(58) Field of Classification Search
CPC .......... H05K 3/46; H01L 21/47; H01L 21/48; B32B 7/12; B32B 38/04; B32B 38/10
USPC .......... 174/255, 250, 261, 262, 264; 29/830, 29/831, 842, 846; 156/50, 150, 221, 247, 156/248; 428/209, 344, 446, 458
See application file for complete search history.

(56) References Cited

U.S. PATENT DOCUMENTS

| 8,707,554 | B2* | 4/2014 | Maeda | H01L 21/4846 29/825 |
|---|---|---|---|---|
| 8,959,760 | B2* | 2/2015 | Niki | H05K 3/4682 174/255 |
| 2003/0168255 | A1* | 9/2003 | Kim | H05K 3/4623 174/261 |
| 2004/0191491 | A1* | 9/2004 | Sugaya | H05K 3/20 428/209 |
| 2005/0155222 | A1* | 7/2005 | Nakamura | H05K 3/0097 29/830 |
| 2007/0124924 | A1* | 6/2007 | Nakamura | H05K 3/0097 29/830 |
| 2008/0142256 | A1* | 6/2008 | Shuto | H01L 21/4857 174/262 |
| 2008/0202661 | A1* | 8/2008 | Kobayashi | H01L 21/4857 156/50 |
| 2009/0314519 | A1* | 12/2009 | Soto | H01L 21/4857 174/250 |
| 2010/0314037 | A1* | 12/2010 | Liu | H01L 21/6835 156/248 |
| 2011/0056614 | A1* | 3/2011 | An | C25D 7/12 156/150 |
| 2011/0079349 | A1* | 4/2011 | Cho | H05K 3/4682 156/247 |
| 2011/0159282 | A1* | 6/2011 | Kim | H05K 3/4682 428/344 |
| 2012/0124829 | A1* | 5/2012 | Kamei | G11B 5/486 29/846 |
| 2012/0241082 | A1* | 9/2012 | Chen | H05K 3/007 156/150 |
| 2014/0054259 | A1* | 2/2014 | Tateoka | H05K 3/022 216/13 |
| 2014/0096381 | A1* | 4/2014 | Tateoka | H05K 3/022 29/846 |

FOREIGN PATENT DOCUMENTS

| JP | 2007-158174 | 6/2007 |
|---|---|---|
| JP | 2008-218450 | 9/2008 |
| JP | 2009-032918 | 2/2009 |
| JP | 2010-251690 | 11/2010 |

* cited by examiner

SUPPORT BODY, METHOD OF MANUFACTURING SUPPORT BODY, METHOD OF MANUFACTURING WIRING BOARD, METHOD OF MANUFACTURING ELECTRONIC COMPONENT, AND WIRING STRUCTURE

This application claims priority from Japanese Patent Application No. 2012-162005, filed on Jul. 20, 2012, the entire contents of which are herein incorporated by reference.

BACKGROUND

1. Technical Field

The present disclosure relates to a support body, a manufacturing method of the support body, a manufacturing method of a wiring board, a manufacturing method of an electronic component, and a wiring structure.

2. Description of the Related Art

A manufacturing method of a wiring board is known in which prescribed numbers of wiring layers and insulating layers are formed on a support body and then the support body is removed. In this manufacturing method of a wiring board, an underlying layer is formed in a wiring forming area on a support substrate (temporary substrate) obtained by curing a prepreg, and a metal foil which is larger than the underlying layer is formed on the underlying layer and adhered to part of the support substrate outside the wiring forming area. The metal foil is merely in contact with the underlying layer and is not adhered to the underlying layer.

Then, a multilayer wiring structure is produced by providing prescribed numbers of wiring layers and insulating layers on the metal foil of the support body and the support body including the metal foil is thereafter removed. In the steps of removing the support body, a first the metal foil is removed from the support substrate and then the metal foil is removed by etching, for example. As a result, a multilayer wiring structure including the wiring layers and the insulating layers is obtained. Wiring boards are completed by dividing the multilayer wiring structure into individual units by cutting it at prescribed positions (see e.g., JP-A-2009-32918).

However, in the above manufacturing method of a wiring board, the support substrate and the metal foil are adhered to each other rigidly outside the wiring forming area of the support body. Therefore, in removing the support body, it is difficult to remove the metal foil from the support substrate by peeling the metal foil off the support substrate mechanically.

Therefore, the metal foil is removed from the support substrate by cutting out the portions (where the support substrate and the metal foil are adhered to each other rigidly), outside the underlying layer, of the support body and the multilayer wiring structure formed thereon.

As described above, in the above manufacturing method of a wiring board, since the outer peripheral portion of the support body is cut out, the portion of the multilayer wiring structure corresponding to the outer peripheral portion of the support body is not available for parts of wiring boards. This causes a problem that the number of individual wiring boards is smaller than that in a case that the portion, formed on the outer peripheral portion of the support body (support substrate), of the multilayer wiring structure is available for parts of wiring boards. Another problem is that the size reduction of wiring boards due to the cutting may make it impossible to use an existing manufacturing facility. These problems result from the fact the support substrate and the metal foil are adhered to each other rigidly and cannot be peeled off each other easily.

SUMMARY OF THE INVENTION

It is one of objects of the present invention to provide a manufacturing method of a support body having such a structure that a metal foil can be peeled off a support substrate easily.

According to one or more aspects of the present invention, there is provided a support body. The support body comprises: a support substrate; an adhesion adjusting layer embedded in the support substrate in a certain region of the support substrate excluding an outer peripheral portion of the support substrate; a peeling layer formed on the support substrate so as to cover the adhesion adjusting layer, wherein the peeling layer is adhered to the outer peripheral portion of the support substrate; a metal foil formed on the peeling layer, wherein the adhesion adjusting layer is configured to adjust a contact area between the peeling layer and the support substrate.

DETAILED DESCRIPTION

Figure 1:
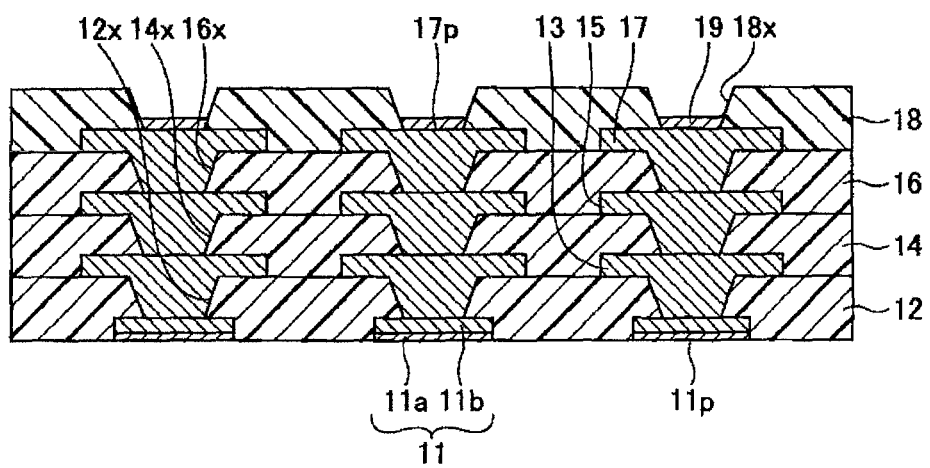
FIG. 1 is a sectional view of a wiring board according to an embodiment.

Exemplary embodiments of the present invention will be hereafter described with reference to the drawings. The same constituent items in the drawings are given the same reference symbol, and the redundant descriptions may be omitted.

First, the structure of a wiring board according to an embodiment will be described. FIG. 1 is a sectional view of the wiring board according to the embodiment.

As shown in FIG. 1, the wiring board 10 is a coreless build-up wiring board having a wiring layer 11, an insulating layer 12, a wiring layer 13, an insulating layer 14, a wiring layer 15, an insulating layer 16, a wiring layer 17, a solder resist layer 18, and a surface treatment layer 19.

In FIG. 1, for the sake of convenience, the side of the insulating layer 12 and the side of the solder resist layer 18 are regarded as the bottom side and the top side, respectively. For example, that surface of the insulating layer 12 which is in contact with the insulating layer 14 is its top surface and the exposed surface of the insulating layer 12 (i.e., the surface that is opposite to its surface being in contact with the insulating layer 14) is its bottom surface.

In the wiring board 10, the wiring layer 11 has a first layer 11a and a second layer 11b and portions of the first layer 11a are exposed from the insulating layer 12. For example, the first layer 11a may be a conductive layer which is obtained by forming a gold (Au) film, a palladium (Pd) film, and a nickel (Ni) film sequentially in this order so that the gold film is exposed. For example, the second layer 11b may be a conductive layer including a copper (Cu) layer. The thickness of the wiring layer 11 may be about 10 to 30 μm, for example.

For example, those portions of the first layer 11a which are exposed from the insulating layer 12 serve as electrode pads to be electrically connected to a mounting board (not shown) such as a mother board. In the following description, those portions of the first layer 11a which are exposed from the insulating layer 12 may particularly be referred to as first electrode pads 11p. For example, the plan-view shape of each first electrode pad 11p may be a circle having a diameter of about 200 to 1,000 μm. The pitch of the first electrode pads 11p may be about 500 to 1,200 μm, for example.

The insulating layer 12 is formed so as to cover the upper surface (excluding portions that are in contact with a through via of the wiring layer 13) and the side surface of the wiring layer 11 and to expose the bottom surface (i.e., the surface that is opposite to the surface that is connected to the through via of the wiring layer 13). The insulating layer 12 may be made of, for example, a thermosetting insulating resin having an epoxy resin as the main component. The thickness of the insulating layer 12 may be about 15 to 35 μm, for example. The insulating layer 12 may contain a filler such as silica ($SiO_2$).

The wiring layer 13, which is formed on the insulating layer 12, includes a wiring pattern formed on the top surface of the insulating layer 12 and a through via which fills a via hole 12x which penetrates through the insulating layer 12 and exposes a portion of the top surface of the wiring layer 11. The via hole 12x is a truncated-cone-shaped hole in which the open end on the side of the insulating layer 14 is larger in diameter than the open end on the side of the wiring layer 11. The diameter of the open end of the via hole 12x may be about 50 μm, for example.

The wiring layer 13 is electrically connected to a certain portion of the wiring layer 11 which is exposed from the bottom open end of the via hole 12x. The wiring layer 13 may be made of copper (Cu), for example. The thickness of the wiring pattern of the wiring layer 13 may be about 10 to 20 μm, for example.

The insulating layer 14 is formed on the top surface of the insulating layer 12 to cover the wiring layer 13. For example, the material and the thickness of the insulating layer 14 may be the same as those of the insulating layer 12. The insulating layer 14 may contain a filler such as silica ($SiO_2$).

The wiring layer 15, which is formed on the insulating layer 14, includes a wiring pattern formed on the top surface of the insulating layer 14 and a through via which fills a via hole 14x which penetrates through the insulating layer 14 and exposes a portion of the top surface of the wiring layer 13. The via hole 14x is a truncated-cone-shaped hole in which the open end on the side of the insulating layer 16 is larger in diameter than the open end on the side of the wiring layer 13. The diameter of the open end of the via hole 14x may be about 50 μm, for example.

The wiring layer 15 is electrically connected to a certain portion of the wiring layer 13 which is exposed from the bottom open end of the via hole 14x. For example, the wiring layer 15 may be made of the same material as the wiring layer 13. The thickness of the wiring pattern of the wiring layer 15 may be about 10 to 20 μm, for example.

The insulating layer 16 is formed on the insulating layer 14 so as to cover the wiring layer 15. For example, the material and the thickness of the insulating layer 14 may be the same as those of the insulating layer 12. The insulating layer 16 may contain a filler such as silica ($SiO_2$).

The wiring layer 17, which is formed on the insulating layer 16, includes a wiring pattern formed on the top surface of the insulating layer 16 and a through via which fills a via holes 16x which penetrates through the insulating layer 16 and exposes a portion of the top surface of the wiring layer 15. The via hole 16x is a truncated-cone-shaped hole in which the open end on the side of the solder resist layer 18 is larger in diameter than the open end on the side of the wiring layer 15. The diameters of the open end of the via hole 16x may be about 50 μm, for example.

The wiring layer 17 is electrically connected to a certain portion of the wiring layer 15 which is exposed from the bottom open ends of the via holes 16x. For example, the wiring layer 17 may be made of the same material as the wiring layer 13. The thickness of the wiring pattern of the wiring layer 17 may be about 10 to 20 μm, for example.

The solder resist layer 18 is formed on the insulating layer 16 so as to cover the wiring layer 17. The solder resist layer 18 has openings 18x, and a portion of the wiring layer 17 is exposed from the bottom open end of the opening 18x. For example, the portion of the wiring layer 17 which is exposed from the bottom open end of the openings 18x serves as an electrode pad to be electrically connected to a semiconductor chip or the like.

In the following description, the portion of the wiring layer 17 which is exposed from the bottom open ends of the opening 18x may particularly be referred as to second electrode pads 17p. For example, the plan-view shape of each second electrode pad 17p may be a circle having a diameter of about 40 to 120 μm. The pitch of the second electrode pads 17p may be about 100 to 200 μm, for example.

The surface treatment layer 19 is formed on the second electrode pad 17p if necessary. For example, the surface treatment layer 19 may be an Au layer, an Ni/Au layer (a metal layer obtained by forming an Ni layer and an Au layer in this order), and an Ni/Pd/Au layer (a metal layer obtained by forming an Ni layer, a Pd layer, and an Au layer in this order). The surface treatment layer 19 may be formed by performing an anti-oxidation treatment such as an OSP (organic solderability preservation) treatment on the second electrode pad 17p.

In the wiring board 10, the wiring pattern of the wiring layer 17 may be extended on the insulating layer 16 so as to form a portion that is exposed from the opening 18x of the solder resist layer 18 and serve as a second electrode pad 17p. That is, a portion, not located over the via hole 16x, of the wiring layer 17 may be made the second electrode pad 17p.

Next, a manufacturing method of a wiring board according to the embodiment will be now described. FIGS. 2A and 2B to FIGS. 7A and 7B illustrate the manufacturing method of a wiring board 10 according to the embodiment. In the manufacturing method according to the embodiment, plural wiring boards are formed on each surface of a support body and are divided into individual wiring boards after removal of the support body. However, another manufacturing process is possible in which a single wiring board is formed on each surface of a support body and the support body is then removed.

Figure 2A:
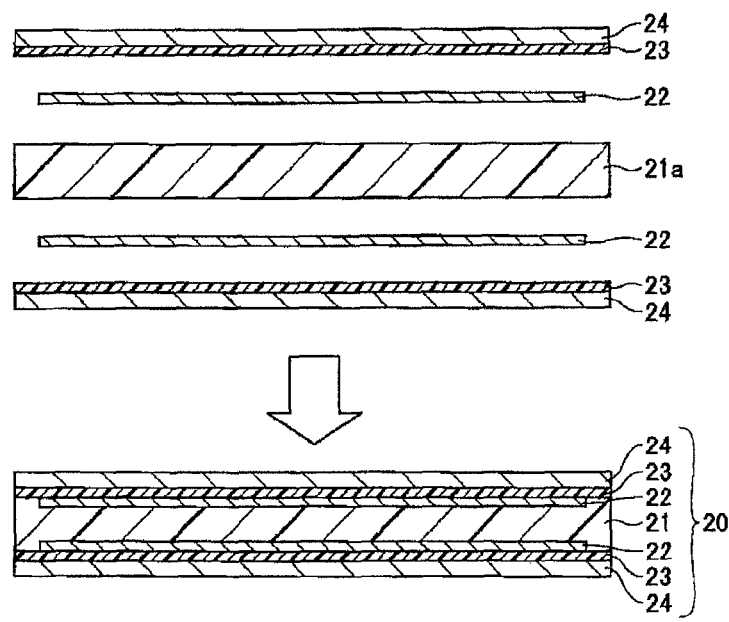
FIGS. 2A and 2B are the first views illustrating a manufacturing process of a wiring board according to the embodiment.
Figure 2B:
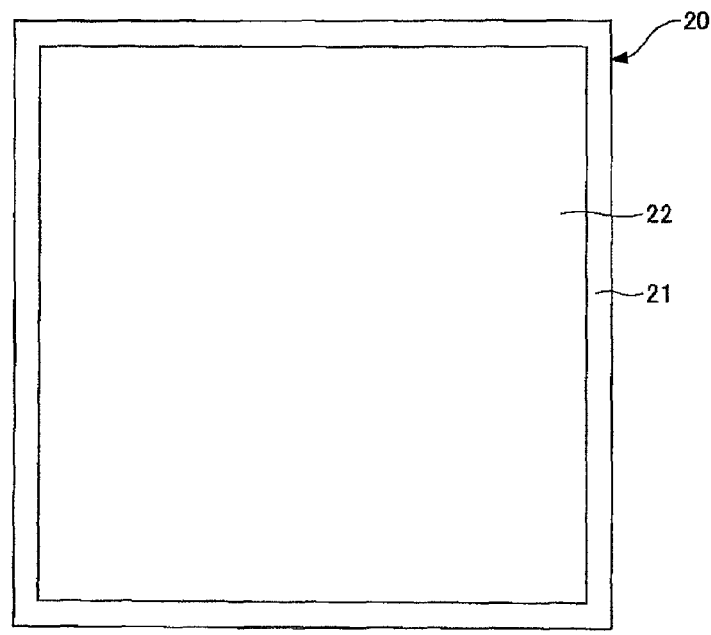

First, a support body 20 is formed as shown in FIGS. 2A and 2B, which are a sectional view and a plan view, respectively. FIG. 2B shows only part of the support body 20.

To manufacture the support body 20, first, a prepreg 21a is prepared in which a glass cloth (woven fabric), a glass unwoven fabric, an aramid fiber, or the like is impregnated with an epoxy resin. The prepreg 21a is in the B-stage (half-set state). For example, the plan-view shape of the prepreg 21a may be a rectangle whose vertical and horizontal dimensions are about 400 to 500 mm. The thickness of the prepreg 21a may be about 60 to 800 μm, for example.

Then, two adhesion adjusting layers 22 are prepared and placed on both surfaces of the prepreg 21a in prescribed regions not including outer peripheral regions, respectively. The adhesion adjusting layers 22 are used for adjusting the contact area between a support substrate 21 (described later) which will be formed when the prepreg 21a is cured and each peeling layer 23 (described later).

For example, the adhesion adjusting layer 22 may be a metal foil such as a copper foil, an aluminum foil, a nickel foil, or a zinc foil, a ceramic plate, a resin sheet having an acrylic resin, a polyimide resin, or the like as the main component. For example, the plan-view shape of the adhesion adjusting layer 22 may be a rectangle that is smaller than the plan-view shape of the prepreg 21a. The thickness of each adhesion adjusting layer 22 may be about 10 to 100 μm, for example.

Then, two metal foils 24 each having a peeling layer 23 thereon are prepared, and the two metal foils 24 are placed on the adhesion adjusting layers 22 and the outer peripheral regions of the surfaces of the prepreg 21a, respectively while the peeling layers 23 face the prepreg 21a. That is, the adhesion adjusting layer 22, the peeling layer 23, and the metal foil 24 are placed on each surface of the prepreg 21a in this order from the side of the prepreg 21a.

Each metal foil 24 may be a copper foil, an aluminum foil, a nickel foil, a zinc foil, or the like. For example, the plan-view shape of each metal foil 24 may be a rectangle having approximately the same size as the plan view shape of the prepreg 21a. The thickness of each metal foil 24 may be several tens of micrometers, for example.

The peeling layers 23 may be made of a fluororesin (ETFE), for example. For example, each peeling layer 23 can be obtained by forming a fluororesin (ETFE) layer on a metal foil 24. Alternatively, the peeling layers 23 may be made of a silicone resin.

As a further alternative, each peeling layer 23 may be formed by performing a releasing treatment on the surface of a metal foil 24 using a releasing agent. For example, a peeling layer 23 may be formed by applying or spraying a silicone releasing agent, a fluorine releasing agent, or the like on the surface of a metal foil 24. The thickness of each peeling layer 23 may be about 1 μm, for example.

As a result, that surface of each peeling layer 23 which is not in contact with the metal foil 24 has such a property as to be easily peeled off another member after being brought into contact with it. Since each peeling layer 23 is temporarily adhered to only the outer peripheral portion of the prepreg 21a, each peeling layer 23 need not always be formed on the whole of one surface of a metal foil 24. Each peeling layer 23 may be formed at least on that portion of a metal foil 24 which is to come into contact with the outer peripheral portion of the prepreg 21a.

Then, while the members that are disposed as shown in FIG. 2A over the arrow are heated, for example, in a vacuum atmosphere at about 190 to 200° C., the metal foils 24 are pressed against the prepreg 21a. As a result, as shown under the arrow in FIG. 2A, the prepreg 21a is cured to be a support substrate 21 and the peeling layers 23 are temporarily adhered to the outer peripheral portion of the support substrate 21 in such a state that the peeling layers 23 can be peeled off the outer peripheral portion of the support substrate 21.

The adhesion adjusting layers 22 are embedded in the support substrate 21 on its respective sides and thereby adhered rigidly to the support substrate 21. The surface of each adhesion adjusting layer 22 may be flush with the corresponding surface of the support substrate 21. Also, the surface of each adhesion adjusting layer 22 may be located above or below the corresponding surface of the support substrate 21.

Part of each peeling layer 23 is in contact with the surface, exposed from (the surface of) the support substrate 21, of the corresponding adhesion adjusting layer 22. However, since having no adhesion, each peeling layer 23 is merely in contact with and is not adhered to the surface, exposed from the support substrate 21, of the corresponding adhesion adjusting layer 22.

The term "temporary adhering" means that members concerned are not adhered to each other rigidly, that is, they are adhered to each other with such adhesion as to be peeled off each other easily by mechanical force. It is preferable that the peel strength between the outer peripheral portion of the support substrate 21 and each peeling layer 23 be about 5 to 600 g/cm. It is more preferable that the peel strength be about 30 to 400 g/cm. These peel strength ranges are determined in view of the fact that the peeling layers 23 can easily be peeled off the support substrate 21 in removing the support body 20 and that the peeling layers 23 is not peeled off the support substrate 21 in the other steps.

Subsequently, as shown in FIGS. 3A-5B, a multilayer wiring structure is formed on the outer surface of each metal foil 24 of the support body 20 by forming prescribed numbers of wiring layers and insulating layers. First, in the step shown in FIG. 3A, a resist layer 100 is formed on the outer surface of each metal foil 24 of the support body 20 so as to have openings 100x corresponding to intended patterns of a wiring layer 11. More specifically, a resist in liquid or paste form which is a photosensitive resin composition containing an epoxy resin, an imide resin, or the like is applied to the outer surface of each metal foil 24 of the support body 20.

Alternatively, a resist in film form (e.g., dry film resist) which is a photosensitive resin composition containing an epoxy resin, an imide resin, or the like is laminated on the outer surface of each metal foil 24 of the support body 20. Then, openings 100x are formed by exposing and developing the laminated resist, whereby a resist layer 100 having the openings 100x are formed. As a further alternative, a resist in film form in which openings 100x are formed in advance may be laminated on the outer surface of each metal foil 24 of the support body 20.

Figure 3A:
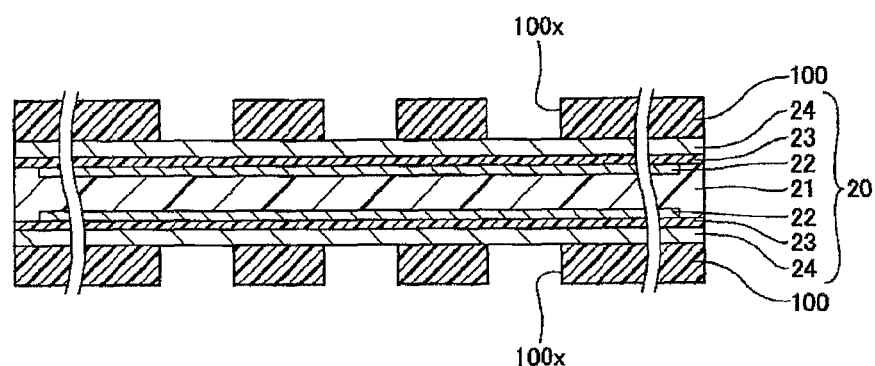
FIGS. 3A-3C are the second views illustrating the manufacturing process of the wiring board according to the embodiment.
Figure 3B:
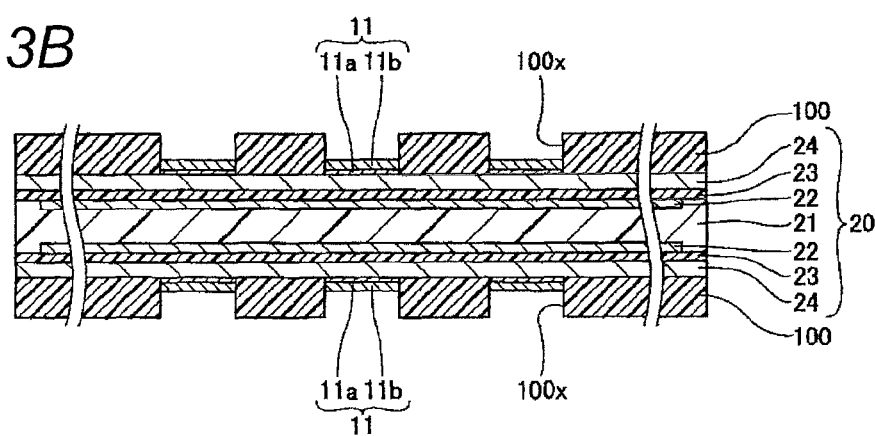
Figure 3C:
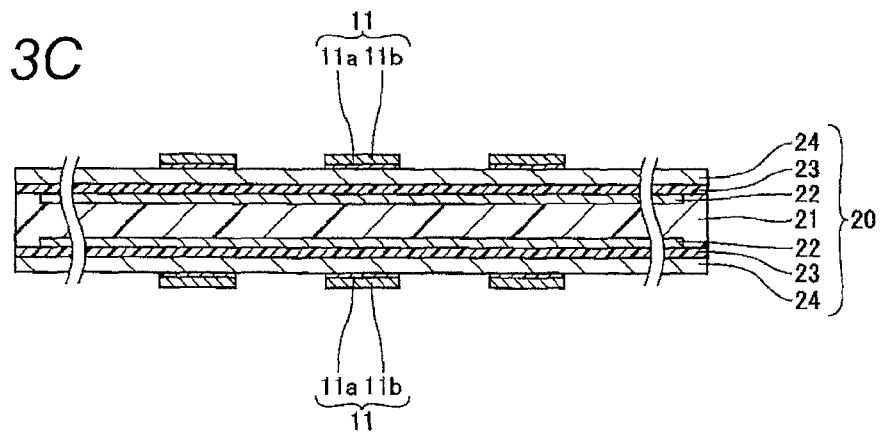

The arrangement pitch of the openings 100x which are formed at positions corresponding to intended patterns of a wiring layer 11 to be formed in the step shown in FIG. 3B (described later) may be about 500 to 1,200 μm, for example. For example, the plan-view shape of each opening 100x may be a circle having a diameter of about 200 to 1,000 µm. Although plural wiring boards will be formed on the outer surface of each metal foil 24 of the support body 20, FIG. 3A shows only a pair of wiring boards and their neighborhoods and the corresponding portion of the support body 20 as well as the outer peripheral portion of the support body 20. FIGS. 3B-6B are shown in the same manner.

Then, in the step shown in FIG. 3B, a wiring layer 11 including a first layer 11a and a second layer 11b is formed on the portions, exposed from the respective openings 100x, of the outer surface of each metal foil 24 of the support body 20 by, for example, electroplating using each metal foil 24 as a plating electricity supply layer. For example, the first layer 11a has a structure that a gold (Au) film, a palladium (Pd) film, and a nickel (Ni) film are laid sequentially in this order from the outer surface of each metal foil 24.

Therefore, to form a wiring layer 11, first, a first layer 11a is formed by plating a gold (Au) film, a palladium (Pd) film, and a nickel (Ni) film sequentially by, for example, electroplating using each metal foil 24 as a plating electricity supply layer. Then, a second layer 11b which is a copper (Cu) layer or the like is formed on the first layer 11a by, for example, electroplating using each metal foil 24 as a plating electricity supply layer. Then, in the step shown in FIG. 3C, the resist layer 100 shown in FIG. 3B is removed.

Figure 4A:
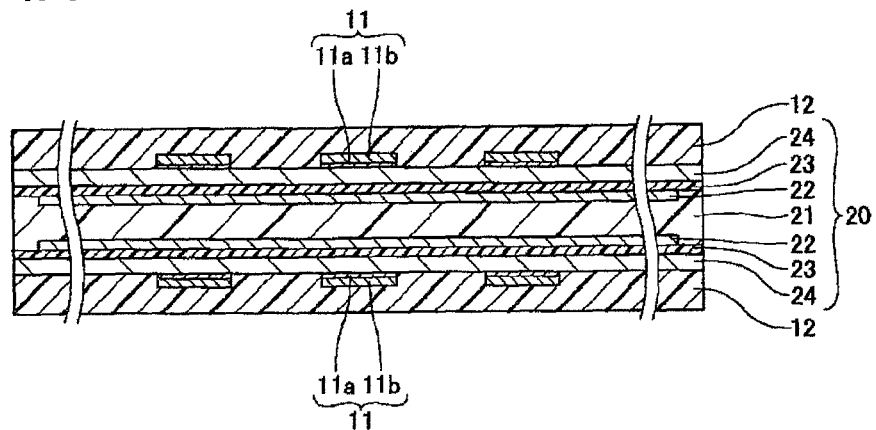
FIGS. 4A-4C are the third views illustrating the manufacturing process of the wiring board according to the embodiment.

Then, in the step shown in FIG. 4A, an insulating layer 12 is formed by laminating an epoxy resin in film form, for example, on the outer surface of each metal foil 24 so as to cover the wiring layer 11 and curing the epoxy resin. Alternatively, an insulating layer 12 may be formed by applying an epoxy resin in paste form, for example, on the outer surface of each metal foil 24 so as to cover the wiring layer 11 and curing the epoxy resin. The thickness of each insulating layer 12 may be 15 to 35 µm, for example. The insulating layers 12 may contain a filler such as silica ($SiO_2$). The generation of voids can be prevented by laminating an epoxy resin or the like in a vacuum atmosphere, Then, in the step shown in FIG. 4B, via holes 12x are formed in each insulating layer 12 so as to penetrate through it and expose portions of the surface of the wiring layer 11 by, for example, laser process using a $CO_2$ laser. It is preferable to perform desmearing after the formation of the via holes 12x to remove resin residues that are remained on the portions, exposed at the bottom open ends of the via holes 12x, of the surface of each wiring layer 11.

Figure 4B:
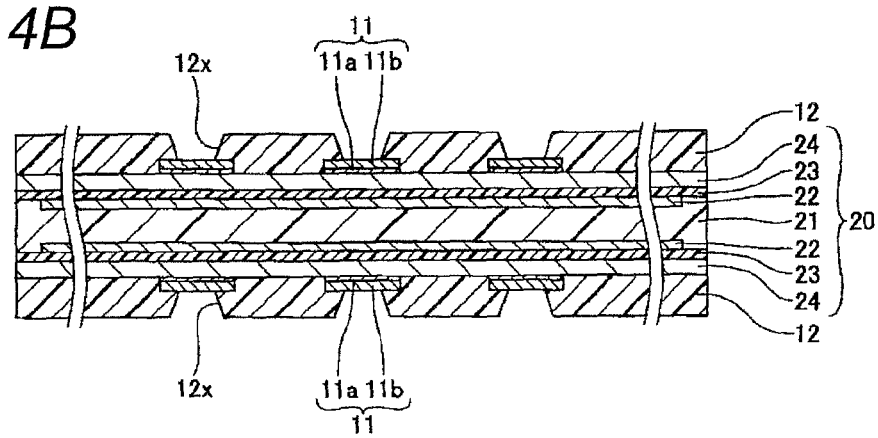
Figure 4C:
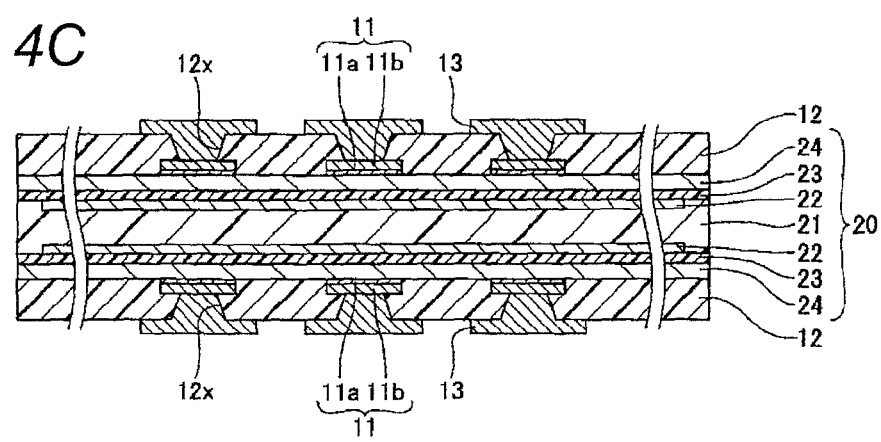

Then, in the step shown in FIG. 4C, a wiring layer 13 is formed on each insulating film 13. The wiring layer 13 includes a through via which fills the via hole 12x and a wiring pattern formed on the insulating layer 12. The wiring layer 13 is electrically connected to a portion of the wiring layer 11 which is exposed in the bottom open end of the via hole 12x. The wiring layer 13 may be made of copper (Cu), for example. The thickness of the wiring pattern of the wiring layer 13 may be about 10 to 20 µm, for example. Each wiring layer 13 can be formed by any of various wiring forming methods such as a semi-additive method and a subtractive method.

Figure 5A:
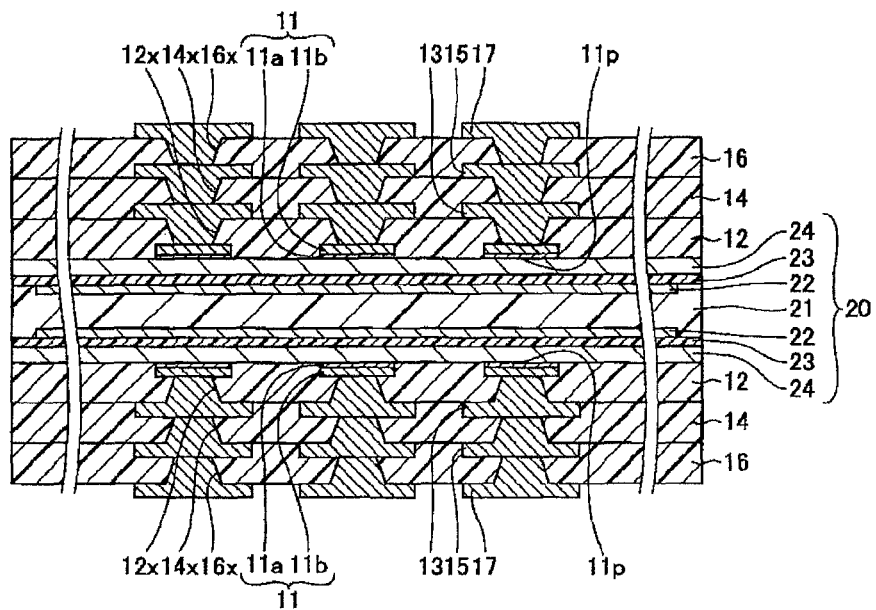
FIGS. 5A and 5B are the fourth views illustrating the manufacturing process of the wiring board according to the embodiment.

Then, in the step shown in FIG. 5A, an insulating layer 14, a wiring layer 15, an insulating layer 16, and a wiring layer 17 are formed on each wiring layer 13 by repeatedly performing the steps of FIGS. 4A-4C. A certain number of wiring layers and insulating layers can be formed.

More specifically, an insulating layer 14 is formed on each insulating layer 12 so as to cover the wiring layer 13. Via holes 14x are formed so as to penetrate through the insulating layer 14 and expose respective portions of the surface of each wiring layer 13. For example, the material and the thickness of the insulating layers 14 may be the same as those of the insulating layers 12. The insulating layers 14 may contain a filler such as silica ($SiO_2$).

Then, a wiring layer 15 is formed on each insulating layer 14. The wiring layer 15 includes a through via which fills the via hole 14x and a wiring pattern formed on the insulating layer 14. The wiring layer 15 is electrically connected to a portion of the wiring layer 13 which is exposed from the bottom open end of the via hole 14x. For example, the wiring layer 15 may be made of the same material as the wiring layer 13.

Then an insulating layer 16 is formed on each insulating layer 14 so as to cover the wiring layer 15. Via holes 16x are formed so as to penetrate through the insulating layer 16 and expose respective portions of the surface of each wiring layer 15. For example, the material and the thickness of the insulating layers 16 may be the same as those of the insulating layers 12. The insulating layers 16 may contain a filler such as silica ($SiO_2$).

Then, a wiring layer 17 is formed on each insulating layer 16. The wiring layer 17 includes a through via which fills the via hole 16x and a wiring pattern formed on the insulating layer 16. The wiring layer 17 is electrically connected to a portion of the wiring layer 15 which is exposed from the bottom open end of the via hole 16x. For example, the wiring layer 17 may be made of the same material as the wiring layer 13.

Figure 5B:
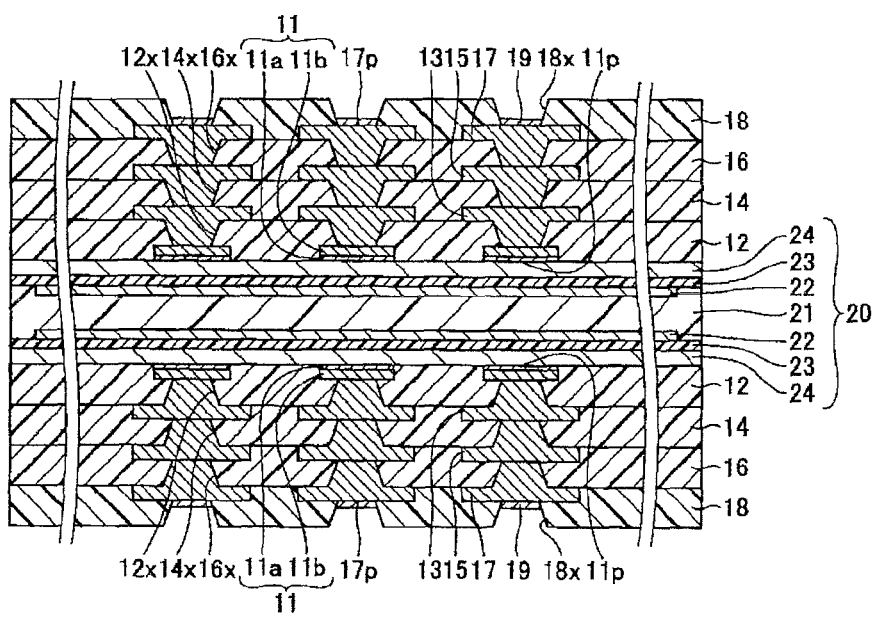

Then, in the step shown in FIG. 5B, a solder resist layer 18 is formed on each insulating layer 16 so as to cover the wiring layer 17. For example, a solder resist layer 18 can be formed by applying a photosensitive epoxy insulating resin in liquid or paste form on each insulating layer 16 by screen printing, roll coating, spin coating so as to cover the wiring layer 17. Alternatively, for example, a photosensitive epoxy insulating resin in film form may be laminated on each insulating layer 16 so as to cover the wiring layer 17.

Openings 18x are formed through each solder resist layer 18 by exposing and developing the laminated insulating resin (photolithography). Alternatively, openings 19x may be formed by laser processing, blasting, or the like. As a result, second electrode pads 17p are formed which are portions of each wiring layer 17 exposed in the bottom open ends of the openings 18x, respectively. For example, the plan-view shape of each second electrode pad 17p may be a circle having a diameter of about 40 to 120 µm. The pitch of the second electrode pads 17p may be about 100 to 200 µm, for example.

If necessary, a surface treatment layer 19 may be formed on each of second electrode pads 17p. For example, the surface treatment layer 19 may be an Au layer, an Ni/Au layer (a metal layer obtained by forming an Ni layer and an Au layer in this order), and an Ni/Pd/Au layer (a metal layer obtained by forming an Ni layer, a Pd layer, and an Au layer in this order). The surface treatment layer 19 may be formed by performing an anti-oxidation treatment such as an OSP (organic solderability preservation) treatment on each of the second electrode pads 17p.

The structure shown in FIG. 5B is a typical example of a wiring structure according to the invention (i.e., a wiring structure including a support body and multilayer wiring structures including prescribed numbers of wiring layers and insulating layers are formed on the outer surface of the corresponding one of metal foils of the support body).

Figure 6A:
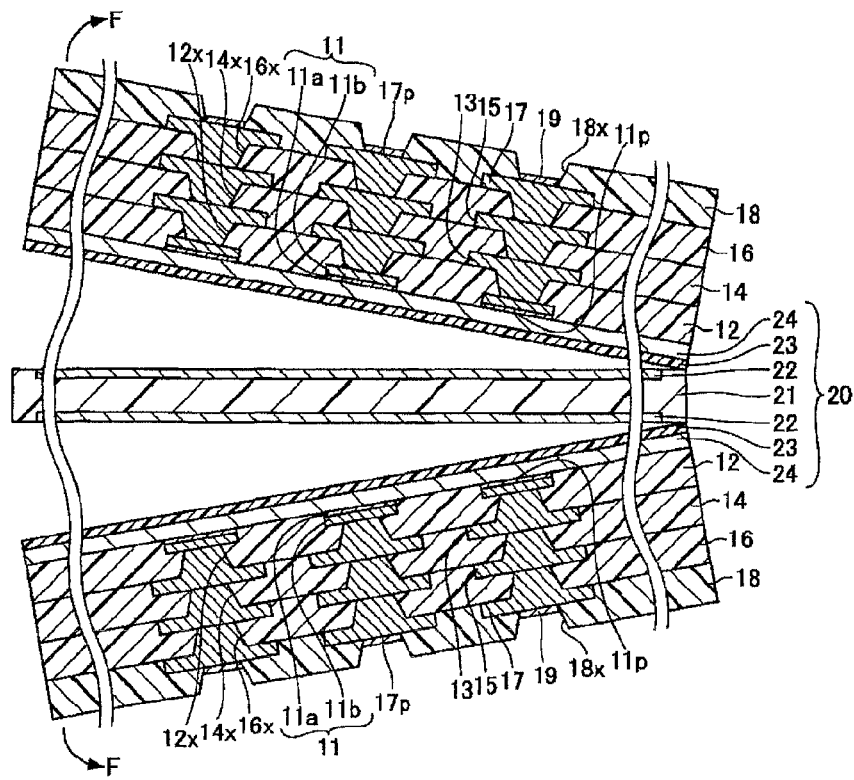
FIGS. 6A and 6B are the fifth views illustrating the manufacturing process of the wiring board according to the embodiment.

Subsequently, in steps shown in FIGS. 6A and 6B, the support body 20 is removed. First, in the step shown in FIG. 6A, the peeling layers 23 are peeled off the support substrate 21 including the adhesion adjusting layers 22 by applying mechanical forces F to the support body 20 in the directions indicated by arrows F. As a result, the support substrate 21 and the adhesion adjusting layers 22 are removed and two structures are obtained, each of which has the metal foil 24 which is formed with the peeling layer 23 on one surface and the multilayer wiring structure on the other surface.

As described above, the support body 20 has the structure that the peeling layers 23 are temporarily adhered to the outer peripheral portions of the two surfaces of the support substrate 21 and are in contact with (not adhered to) the surfaces, exposed from the support substrate 21, of the adhesion adjusting layer 22, respectively. Therefore, the peeling layers 23 can easily be peeled off the support substrate 21 by applying mechanical forces F to the support body 20 in the directions indicated by arrows.

Unlike in the conventional manufacturing method of a wiring board, it is not necessary to cut out a prescribed outer peripheral portion of the support body 20 in, for example, peeling the peeling layers 23 off the support substrate 21. Therefore, there are no portions of multilayer wiring structures that are cut out and the multilayer wiring structures can be thus used efficiently. That is, a larger number of wiring boards 10 can be obtained from a multilayer wiring structure having a prescribed size.

Figure 6B:
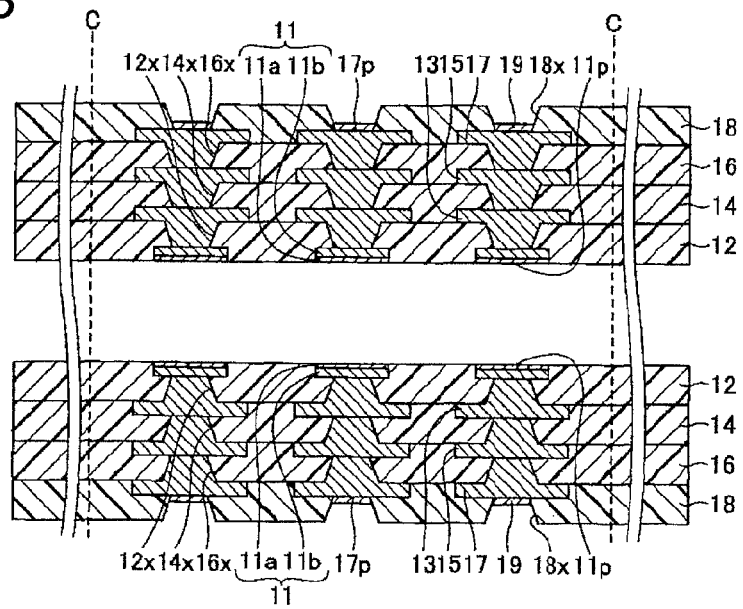

Then, in the step shown in FIG. 6B, the peeling layer and the metal foil 24 are removed from each structure in which one surface of the metal foil 24 is formed with the peeling layer 23 and the other surface is formed with the multilayer wiring structure. Thus, the multilayer wiring structure including the prescribed numbers of wiring layers and insulating layers can be obtained. For example, the peeling layer 23 can be removed by, for example, acid cleaning using dilute sulfuric acid. Then, the metal layer 24 can be removed by etching, for example.

Where the metal foil 24 is a copper foil, it can be removed by, for example, wet etching using an aqueous solution of ferric chloride, an aqueous solution of cupric chloride, an aqueous solution of ammonium persulfate, or the like. In this processing, only the metal foil 24 can be etched selectively because the topmost layer of the wiring layer 11 which is exposed from the insulating layer 12 is the gold (Au) film, for example, and the second electrode pads 17p are covered with the surface treatment layer 19. On the other hand, where the surface treatment layer 19 is not formed and the second electrode pads 17p are made of copper (Cu), it is necessary to mask the second electrode pads 17p to prevent the second electrode pads 17p from being etched together with the metal foil 24. Instead of removing the peeling layer 23 and the metal foil 24 separately, they may be removed simultaneously by etching, for example.

Figure 7A:
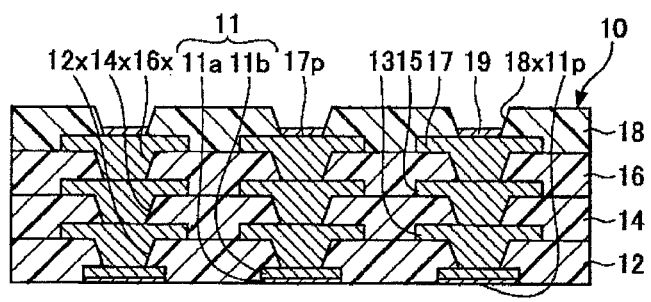
FIGS. 7A and 7B are the sixth views illustrating the manufacturing process of the wiring board according to the embodiment.
Figure 7A:
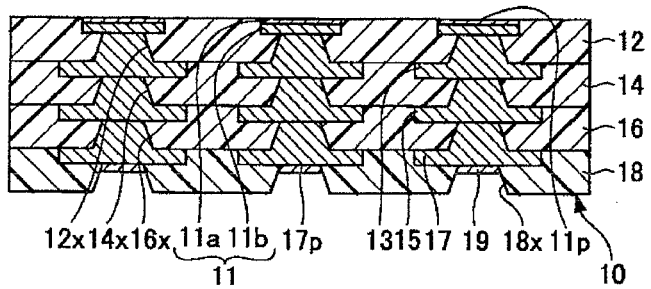

Subsequently, in a step shown in FIG. 7A, plural wiring boards 10 are obtained by dividing each multilayer wiring structure shown in FIG. 6B into individual units by cutting each multilayer wiring structure along cutting positions C by dicing, for example.

Figure 7B:
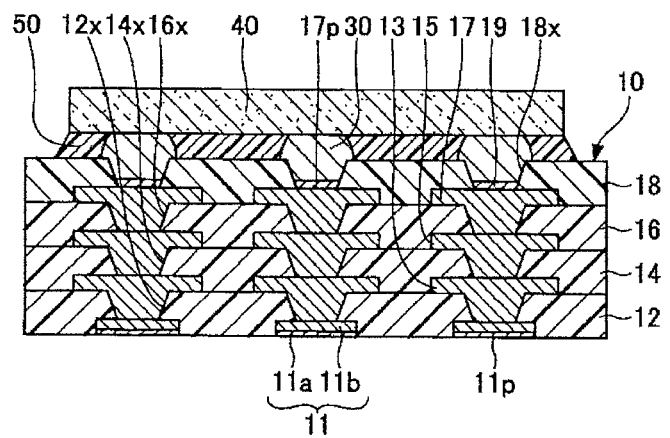

As shown in FIG. 7B, a semiconductor device may be manufactured by mounting a semiconductor chip 40 on a wiring board 10 via bonding portions 30 and filling the space between the wiring board 10 and the semiconductor chip 40 with underfill resin 50. The bonding portions 30 may be solder balls, for example. Example materials of the solder balls are an alloy containing Pb, an alloy of Sn and Cu, an alloy of Sn and Sb, an alloy of Sn and Ag, and an alloy of Sn, Ag, and Cu.

For the sake of convenience, in FIG. 7B, the first electrode pads 11p and the second electrode pads 17p have approximately the same pitch. However, actually, the second electrode pads 17p which are to be electrically connected to the semiconductor chip 40, have a smaller pitch than the first electrode pads 11p which are to be electrically connected to a mounting board such as a mother board. Therefore, in the steps of FIGS. 3A-7A, the wiring board 10 is manufactured so that the second electrode pads 17p have a smaller pitch than the first electrode pads 11p.

Conversely, in the steps of FIGS. 3A-7A, the wiring board 10 may be manufactured so that the first electrode pads 11p have a smaller pitch than the second electrode pads 17p. In this case, the first electrode pads 11p are electrically connected to the semiconductor chip 40 and the second electrode pads 17p are electrically connected to the a mounting board such as a mother board.

Although in FIG. 7B the semiconductor chip 40 is mounted on the wiring board 10, the wiring board 10 may be mounted with capacitors, resistors, inductors, etc. instead of the semiconductor chip 40. That is, an electronic component can be manufactured by mounting a semiconductor device, capacitors, resistors, inductors, etc. on the wiring board 10.

As described above, in the embodiment, the support body 20 has the structure that each peeling layer 23 is temporarily adhered to the outer peripheral portion of the corresponding surface of the support substrate 21 and is in contact with (not adhered to) the surface, exposed from the support substrate 21, of the corresponding adhesion adjusting layer 22. This makes it possible to remove the support body 20 easily in the manufacturing process of the wiring board 10. That is, the peeling layers 23 and the metal foils 24 can easily be separated from the support substrate 21 by mechanically peeling each peeling layer 23 off the support substrate 21 easily. Then, the peeling layer 23 and the metal foil 24 can easily be removed from each multilayer wiring structure by etching, for example.

In removing the support body 20, it is not necessary to cut out a prescribed outer peripheral portion of the support body 20 unlike in the conventional manufacturing method of a wiring board. Therefore, there are no portions of multilayer wiring structures that are cut out and discarded and the multilayer wiring structures can thus be used efficiently. That is, a larger number of wiring boards 10 can be obtained from a multilayer wiring structure having a prescribed size.

If the adhesion between the support substrate 21 and each peeling layer 23 of the support body 20 is too weak, in the manufacturing process of the wiring board 10 a peeling layer 23 may be peeled off the support substrate 21.

In view of the above, the peel strength between the support substrate 21 and each peeling layer 23 is set to a proper value taking into consideration adhesion that is necessary in the manufacturing steps of the wiring board 10 other than the steps of removing the support body 20 and adhesion with which the steps of removing the support body 20 can be executed easily. The peel strength (adhesion) can be determined by adjusting the area of the outer peripheral region (where the adhesion adjusting layer 22 does not exist) of each surface of the support substrate 21, that is, the peel strength can be determined by adjusting the contact area between the support substrate 21 and each peeling layer 23 by changing the ratio of the area of each adhesion adjusting layer 22 to the total area of each surface of the support substrate 21.

It can be considered that a support body having no adhesion adjusting layers is formed and a metal foil with a peeling layer is temporarily adhered to the whole of each surface of the support substrate. However, this structure is not preferable because it is difficult to adjust the peel strength between the support substrate and each peeling layer. If the peel strength is too high, it is highly probable that the support substrate is broken in peeling off the peeling layers. On the other hand, if the peel strength is too low, a peeling layer 23 is very likely peeled off in a wiring board manufacturing process. The support body 20 according to the embodiment is free of this problem, because it has the adhesion adjusting layers 22 and hence the peel strength between the support substrate 21 and each peeling layer 23 can be adjusted easily.

Figure 8A:
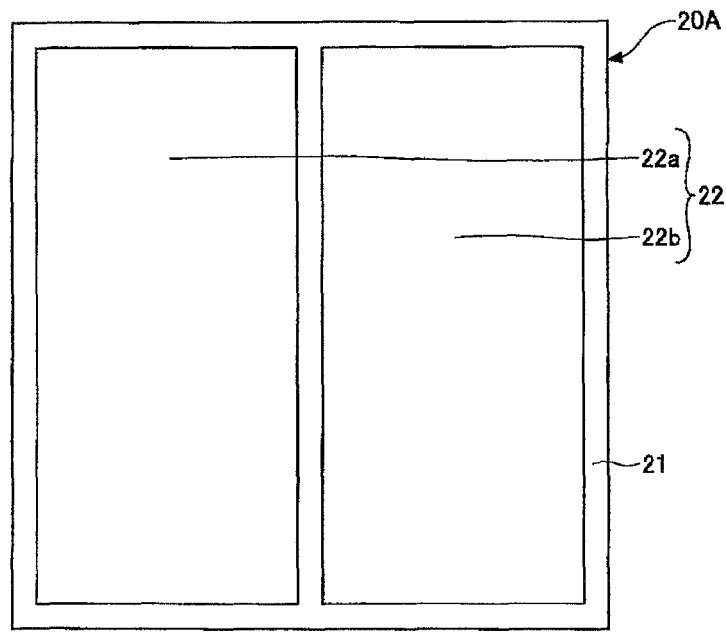
FIGS. 8A and 8B are plan views of support bodies according to respective modifications of the embodiment.
Figure 8B:
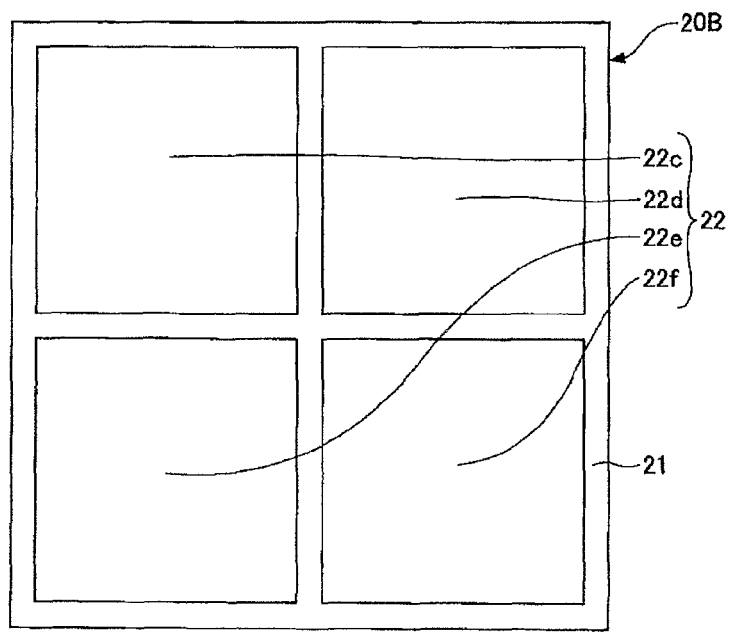

Modifications of the embodiment are directed to other arrangements of adhesion adjusting layers 22 on the support substrate 21. In the modifications of the embodiment, the same components as used in the above-described embodiment will not be described in detail. FIGS. 8A and 8B are plan views of support bodies according to the respective modifications of the embodiment. FIGS. 8A and 8B each show only part of the support body.

As shown in FIG. 8A, a support body 20A is different from the support body 20 (see FIG. 2B) in that each adhesion adjusting layer 22 is divided into two regions 22a and 22b. As shown in FIG. 8B, a support body 20B is different from the support body 20 (see FIG. 2B) in that each adhesion adjusting layer 22 is divided into four regions 22c, 22d, 22e, and 22f.

As shown in FIGS. 8A and 8B, each adhesion adjusting layer 22 may be divided into plural regions. The contact area between the support substrate 21 and each peeling layer 23 is changed by dividing the adhesion adjusting layer 22 into plural regions. Thus, the adhesion (peel strength) between the support substrate 21 and each peeling layer 23 can be adjusted.

Each adhesion adjusting layer 22 may be divided into three regions or five or more regions. The plan-view shape of each region of each adhesion adjusting layer 22 may be a shape that is more complex than a rectangle. For example, the contact area between the support substrate 21 and each peeling layer 23 may be adjusted by changing the shape of each region of each adhesion adjusting layer 22 to a sinusoidal wave shape, a triangular wave shape, a rectangular wave shape, or the like (this also applies to the case that each adhesion adjusting layer 22 is of a single region (see FIG. 2B)).

As described above, the shape of each adhesion adjusting layer 22 can be determined as appropriate taking into consideration the adhesion that is required between the support substrate 21 and each adhesion adjusting layer 22. However, to prevent unintended peeling, entrance of a liquid chemical into the support body 20, etc., the outer peripheral portion of the support substrate 21 is adhered to the peeling layers 23. That is, each adhesion adjusting layer 22 having a proper shape is disposed in the region of the support substrate 21 excluding its peripheral portion.

While the preferred embodiments and their modifications and examples have been described now, the present invention is not limited to the preferred embodiments and their modifications and examples described above, and the preferred embodiments and their modifications and examples may be modified and replaced in various ways without deviating from the scope defined in the appended claims.

For example, in the manufacturing method of a wiring board according to the embodiment, the multilayer wiring structure having the wiring layers and the insulating layers is formed on both sides of the support member 20, but a multilayer wiring structure having wiring layers and insulating layers may be formed on only one side of a support member. In this case, the adhesion adjusting layer 22 and the metal foil 24 having the peeling layer 23 thereon are formed on only one side of the support member.

Electronic element such as semiconductor chips may either be mounted on the members to become wiring boards 10 after the step of FIG. 5B or be mounted on the members to become wiring boards 10 after the step of FIG. 6B. That is, electronic components such as semiconductor chips may either be mounted on the members to become wiring boards 10 before the removal of the support body 10 or be mounted on the members to become wiring boards 10 before the division into individual units.

Various aspects of the subject-matter described herein are set out non-exhaustively in the following numbered clauses:

1. A method of manufacturing a support body, comprising:
   (a) preparing a support substrate;
   (b) preparing a metal foil on which a peeling layer is provided;
   (c) providing an adhesion adjusting layer on the support substrate in a certain region of the support substrate excluding an outer peripheral portion of the support substrate, wherein the adhesion adjusting layer is configured to adjust a contact area between the peeling layer and the support substrate; and
   (d) providing the metal foil on the support substrate such that the peeling layer provided on the metal foil faces the support substrate via the adhesion adjusting layer,
   wherein, in step (d),
   the adhesion adjusting layer is adhered to the support substrate, and
   the peeling layer is adhered to the outer peripheral portion of the support substrate, and is in contact with the adhesion adjusting layer but is not adhered to the adhesion adjusting layer.

2. The method of clause 1, wherein
   the support substrate is made of prepreg, and
   step (d) comprises:
   (d-1) pressing the metal foil against the support substrate while heating the support substrate; and
   (d-2) curing the support substrate.

3. The method of clause 1, wherein the adhesion adjusting layer has a plurality of segments separated from each other.

4. The method of clause 1, wherein
   the support substrate comprises a first surface and a second surface opposite to the first surface,
   the adhesion adjusting layer comprises a first adhesion adjusting layer and a second adhesion adjusting layer, and
   the metal foil comprises a first metal foil on which a first peeling layer is provided and a second metal foil on which a second peeling layer is provided,
   wherein step (c) comprises:
   (c-1) providing the first adhesion adjusting layer on the first surface of the support substrate; and
   (c-2) providing the second adhesion adjusting layer on the second surface of the support substrate, and
   wherein step (d) comprises:
   (d-1) providing the first metal foil on the first surface of the support substrate such that the first peeling layer provided on the first metal foil faces the first surface of the support substrate via the first adhesion adjusting layer; and
   (d-2) providing the second metal foil on the second surface of the support substrate such that the second peeling layer provided on the second metal foil faces the second surface of the support substrate via the second adhesion adjusting layer.

5. A method of manufacturing a wiring substrate, comprising:

(a) providing the support body formed through the method of clause 1;
(b) forming a multilayer wiring structure on the metal foil of the support body, wherein the multilayer wiring structure comprises an insulating layer and a wiring layer;
(c) removing the support substrate and the adhesion adjusting layer by peeling off the peeling layer from the support substrate; and
(d) removing the peeling layer and the metal foil.

6. A method of manufacturing an electronic component, comprising:
(a) providing the wiring board formed through the method of clause 5; and
(b) mounting an electronic element on the wiring board.

What is claimed is:

1. A support body comprising:
a support substrate obtained by heating prepreg so as to cure the prepreg;
an adhesion adjusting layer embedded in the support substrate in a certain region of the support substrate excluding an outer peripheral portion of the support substrate, the adhesion adjusting layer is rigidly adhered to the support substrate;
a peeling layer formed on the support substrate so as to cover the adhesion adjusting layer, wherein the peeling layer is temporarily adhered to the outer peripheral portion of the support substrate, a peel strength between the peeling layer and the support substrate is in a range of 30 g/cm to 400 g/cm, the peeling layer is in contact with the adhesion adjusting layer but is not adhered to the adhesion adjusting layer, and the peeling layer is made of a silicone resin or a fluororesin or is formed using a silicone-based releasing agent or a fluorine-based releasing agent;
a metal foil formed on the peeling layer, the metal foil comprising a first surface on which the peeling layer is formed, and a second surface on which a multilayer wiring structure is to be formed, the second surface being opposite to the first surface,
wherein the adhesion adjusting layer is configured to adjust a contact area between the peeling layer and the support substrate.

2. The support body of claim 1, wherein the peeling layer is temporarily adhered to the outer peripheral portion of the support substrate so as to be peelable from the support substrate, and the adhesion adjusting layer is rigidly adhered to the support substrate so as to be unpeelable from the support substrate.

3. The support body of claim 1, wherein:
the support substrate includes a first surface and a second surface opposite to the first surface;
the adhesion adjusting layer, the peeling layer, and the metal foil are provided on the first surface of the support substrate;
the support body further comprises:
a second adhesion adjusting layer embedded in the second surface of the support substrate in a certain region of the second surface of the support substrate excluding an outer peripheral portion of the second surface of the support substrate, the second adhesion adjusting layer being rigidly adhered to the second surface of the support substrate;
a second peeling layer formed on the second surface of the support substrate so as to cover the second adhesion adjusting layer, wherein the second peeling layer is temporarily adhered to the outer peripheral portion of the second surface of the support substrate, and the second peeling layer is in contact with the second adhesion adjusting layer but is not adhered to the second adhesion adjusting layer; and
a second metal foil formed on the second peeling layer, the second metal foil comprising a secondary first surface on which the second peeling layer is formed, and a secondary second surface on which a second multilayer wiring structure is to be formed, the secondary second surface being opposite to the secondary first surface, and
wherein the second adhesion adjusting layer is configured to adjust a second contact area between the second peeling layer and the second surface of the support substrate.

* * * * *